US010049726B1

(12) United States Patent
Schaefer et al.

(10) Patent No.: US 10,049,726 B1
(45) Date of Patent: Aug. 14, 2018

(54) CONTENTION-FREE DYNAMIC LOGIC

(71) Applicant: Advanced Micro Devices, Inc., Sunnyvale, CA (US)

(72) Inventors: Alexander W. Schaefer, Austin, TX (US); David H. McIntyre, Sunnyvale, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/424,367

(22) Filed: Feb. 3, 2017

(51) Int. Cl.
| | |
|---|---|
| *G11C 7/00* | (2006.01) |
| *G11C 11/419* | (2006.01) |
| *G11C 11/418* | (2006.01) |
| *G11C 7/12* | (2006.01) |
| *G11C 7/02* | (2006.01) |
| *G11C 8/08* | (2006.01) |

(52) U.S. Cl.
CPC .............. *G11C 11/419* (2013.01); *G11C 7/02* (2013.01); *G11C 7/12* (2013.01); *G11C 8/08* (2013.01); *G11C 11/418* (2013.01); *G11C 2207/104* (2013.01)

(58) Field of Classification Search
CPC ..... G11C 7/12; G11C 11/419; G11C 11/4096; G11C 7/22; G11C 8/10; G11C 11/401; G11C 11/4074; G11C 29/12005; G11C 5/063; G11C 5/147; G11C 8/08
USPC ............. 365/185.11, 51, 63, 189.02, 230.02, 365/230.06
See application file for complete search history.

(56) References Cited

U.S. PATENT DOCUMENTS

| | | | |
|---|---|---|---|
| 4,963,772 A | 10/1990 | Dike | |
| 5,036,221 A | 7/1991 | Brucculeri | |
| 5,841,300 A | 11/1998 | Murabayashi | |
| 6,066,965 A | 5/2000 | Blomgren et al. | |
| 6,133,762 A | 10/2000 | Hill | |
| 6,624,665 B2 | 9/2003 | Kim | |
| 7,440,335 B2 * | 10/2008 | Ramaraju | G11C 7/02 365/189.02 |
| 7,698,673 B2 | 4/2010 | Afleck | |
| 7,724,036 B2 | 5/2010 | Das | |

(Continued)

OTHER PUBLICATIONS

U.S. Appl. No. 15/239,217, filed Aug. 17, 2016, entitled "Low Power Adaptive Synchronizer", naming Greg Sadowski et al. as inventors.

(Continued)

*Primary Examiner* — Gene Auduong
(74) *Attorney, Agent, or Firm* — Zagorin Cave LLP

(57) ABSTRACT

A dynamic NOR circuit includes a pre-charge transistor coupled between a first voltage supply node and a dynamic node to pre-charge the dynamic node. The dynamic NOR circuit includes a first keeper circuit having a first keeper transistor and a second keeper transistor serially coupled between the first voltage supply node and the dynamic node. The dynamic NOR circuit includes a first pull down circuit coupled between the dynamic node and ground. A first input signal is coupled to a gate of a first pull-down transistor in the first pull-down circuit and is also coupled to a gate of the first keeper transistor. A first keeper enable signal is coupled to a gate of the second keeper transistor. Additional keeper circuits and pull down circuits coupled to the dynamic node allow the dynamic NOR structure to handle a plurality of input signals.

18 Claims, 5 Drawing Sheets

(56) References Cited

U.S. PATENT DOCUMENTS

| | | | |
|---|---|---|---|
| 7,777,522 | B2 | 8/2010 | Yang |
| 7,902,878 | B2 | 3/2011 | Saint-Laurent |
| 7,977,976 | B1 | 7/2011 | Tang |
| 7,977,977 | B1 | 7/2011 | Natarajan et al. |
| 8,593,171 | B2 | 11/2013 | Kosonocky et al. |
| 8,901,965 | B2 | 12/2014 | Fish |
| 8,912,853 | B2 | 12/2014 | Burnette |
| 8,928,354 | B2 | 1/2015 | Kim |
| 9,123,439 | B2 | 9/2015 | Pilo |
| 9,124,259 | B2 | 9/2015 | Kimoto |
| 9,396,790 | B1 | 7/2016 | Chhabra |
| 9,413,354 | B2 | 8/2016 | Stirk |
| 9,473,141 | B2 | 10/2016 | Kerr |
| 9,552,892 | B1 | 1/2017 | Kosonocky et al. |
| 9,564,901 | B1 | 2/2017 | Chow |
| 2004/0163022 | A1 | 8/2004 | Whetsel |
| 2007/0201298 | A1* | 8/2007 | Ramaraju ........ G11C 7/02 365/230.06 |
| 2009/0024888 | A1 | 1/2009 | Kurimoto |
| 2010/0091688 | A1 | 4/2010 | Staszewski |
| 2012/0044009 | A1 | 2/2012 | Hess |
| 2012/0319781 | A1 | 12/2012 | Scott |
| 2013/0154712 | A1 | 6/2013 | Hess |
| 2014/0091998 | A1 | 4/2014 | Ko |
| 2016/0359487 | A1 | 12/2016 | Nadkarni |

OTHER PUBLICATIONS

Abraham, J., 12. Dynamic CMOS Logic, Department of Electrical and Computer Enginnering, The University of Texas at Austin, VLSI Design, Oct. 10, 2016, 12 pages.

Rabaey, J., "Dynamic CMOS Design," Digital Integrated Circuits, Prentice-Hall, 1996, pp. 223-234.

U.S. Appl. No. 15/299,709, filed Oct. 21, 2016, entitled Pseudo-Dynamic Circuit for Multi-Voltage Timing Interlocks, naming John J. Wuu et al. as inventors.

U.S. Appl. No. 15/492,249, filed Apr. 20, 2017, entitled Contention-Free Dynamic Logic, naming Alexander W. Schaefer as inventor.

* cited by examiner

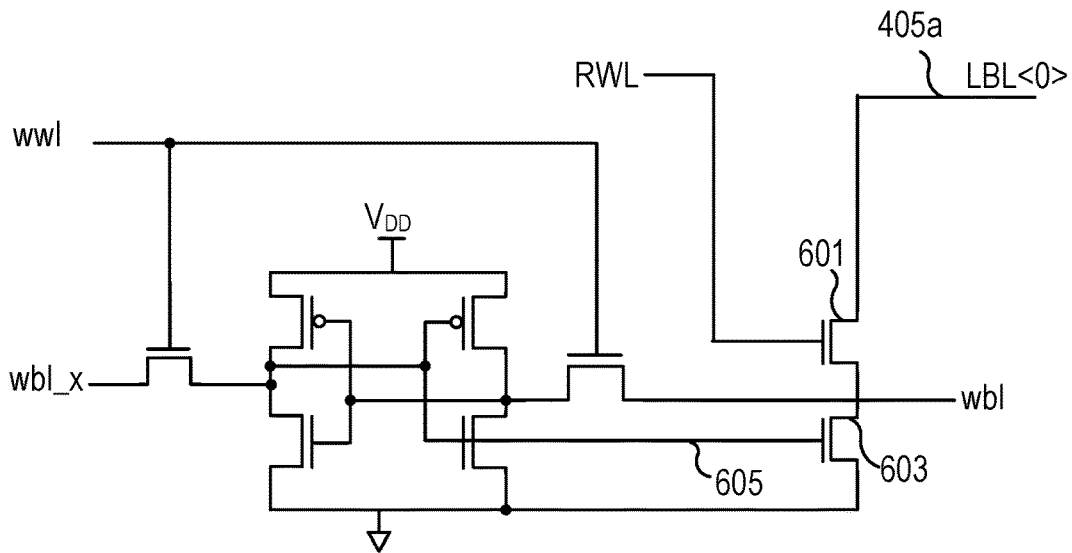

Fig. 6

| Signal | Operation | | |
|---|---|---|---|
| | Precharge | Read 0 | Read 1 |
| PchGBL | 0 | 1 | 1 |
| PchLBL[i] | 0 | 1 | 1 |
| PchLBL[not i] | 0 | 0 | 0 |
| RWL[j] | 0 | 1 | 1 |
| RWL[not j] | 0 | 0 | 0 |
| cells' read port input | X | 1 | 0 |
| KpEnLBL[2m-1:0] | 1 | 1 | 1 |
| KpEnGBL[k] | 1 | 0 | 0 |
| KpEnGBL[not k] | 1 | 1 | 1 |
| LBL[i] | 1 | 0 | 1 |
| LBL[not i] | 1 | 1 | 1 |
| GBLPD[k] | 0 | 1 | 0 |
| GBLPD[not k] | 0 | 0 | 0 |
| GBL | 1 | 0 | 1 |
| Logical constraints guaranteed during reads by the Decoder: | | | |
| One-hot RWLs | | | |
| One-hot PchLBLs | | | |
| One-cold KpEnGBLs | | | |
| One-cold LBLs | | | |
| One-hot GBLPDs | | | |
| Note, KpEnLBL[2m-1:0] are one-cold during reads at low frequencies. | | | |

Fig. 7

CONTENTION-FREE DYNAMIC LOGIC

BACKGROUND

Field of the Invention

This invention relates to dynamic circuits and more particularly to contention-free dynamic circuits.

Description of the Related Art

Dynamic logic circuits are well known in the art. FIG. 1 illustrates a prior art dynamic NOR structure 100. The output node (dynamic conductor) 101 is pre-charged to $V_{DD}$ through p-channel metal oxide semiconductor (PMOS) transistor 103 when the clock signal 105 is low. When the clock signal rises to a high level, an evaluation phase determines the value of the output node 101 based on input signals IN[0] and IN[1]. A high voltage level on the input signal IN[0] activates n-channel metal oxide semiconductor (NMOS) transistor 107 causing the output node 101 to be discharged to ground. Similarly, a high voltage level on the input signal IN[1] activates n-channel metal oxide semiconductor (NMOS) transistor 109 causing the output node 101 to be discharged to ground. If the input signals are zero, the output node remains at the pre-charged voltage level as the path to ground is blocked with transistors 107 and 109 turned off and a keeper transistor 111 activates to keep the output node at the high voltage level. The gate of keeper transistor 111 is coupled to the output of inverter 112 that inverts the value of the output node 101. However, the pull-down transistors 107 and 109 and the keeper transistor 111 can be on at the same time, at least briefly as inputs change, causing contention between the keeper transistor and the pull-down transistors, which can also limit the minimum $V_{DD}$ voltage. The feedback keeper circuit in FIG. 1 can delay evaluation at lower voltages due to contention and may even fail to evaluate at very low voltages. One solution to the contention problem, as described in U.S. Pat. No. 7,977,977, entitled "Dynamic Logic Circuit With Device to Prevent Contention Between Pull-Up and Pull-Down Device", uses delayed onset keepers.

SUMMARY OF EMBODIMENTS OF THE INVENTION

Other solutions to contention problems in dynamic logic circuits are desirable and provided herein. In an embodiment an apparatus includes a first pre-charge transistor coupled between a voltage supply node and a global bit line. A first global keeper circuit includes a first keeper transistor and a second keeper transistor coupled between the voltage supply node and the global bit line. A second pre-charge transistor is coupled between the voltage supply node and a first local bit line. A third pre-charge transistor is coupled between the voltage supply node and a second local bit line. A first global pull down circuit includes a pull-down transistor coupled between the global bit line and a second voltage supply node. A first global keeper enable signal is coupled to a gate of the first keeper transistor and is a logical NOR of a second pre-charge control signal coupled to a gate of the second pre-charge transistor and a third pre-charge control signal coupled to a gate of the third pre-charge transistor.

In another embodiment, a method includes pre-charging a global bit line responsive to assertion of a global bit line pre-charge signal. A decoder circuit decodes a read address at a decoder circuit. The method further includes pre-charging a first local bit line responsive to a first local bit line pre-charge signal supplied from the decoder and pre-charging a second local bit line responsive to a second local bit line pre-charge signal supplied from the decoder. A first global keeper transistor coupled between a voltage supply node and the global bit line is activated responsive to either the first local bit line pre-charge signal or the second local bit line pre-charge signal being deasserted.

In another embodiment, a dynamic logic structure includes a first pre-charge transistor coupled between a first voltage supply node and a dynamic node. A first keeper circuit includes a first keeper transistor and a second keeper transistor serially coupled between the first voltage supply node and the dynamic node. A first pull down circuit is coupled between the dynamic node and a second voltage supply node. A first input signal is coupled to a gate of a first pull-down transistor in the first pull-down circuit and is coupled to a gate of the first keeper transistor. A first keeper enable signal is coupled to a gate of the second keeper transistor. A second keeper circuit includes a third keeper transistor and a fourth keeper transistor serially coupled between the first voltage supply node and the dynamic node. A second pull down circuit is coupled between the dynamic node and the second voltage supply node. A second input signal is coupled to a gate of a second pull-down transistor in the second pull-down circuit and is coupled to a gate of the third keeper transistor. A second keeper enable signal is coupled to a gate of the fourth keeper transistor.

BRIEF DESCRIPTION OF THE DRAWINGS

The present invention may be better understood, and its numerous objects, features, and advantages made apparent to those skilled in the art by referencing the accompanying drawings.

FIG. 6 illustrates a memory cell structure that may be utilized in the memory structure of FIG. 4.

FIG. 7 illustrates a table showing values of control signals of the memory structure of FIG. 4 for various operations.

The use of the same reference symbols in different drawings indicates similar or identical items.

DETAILED DESCRIPTION

Figure 1:
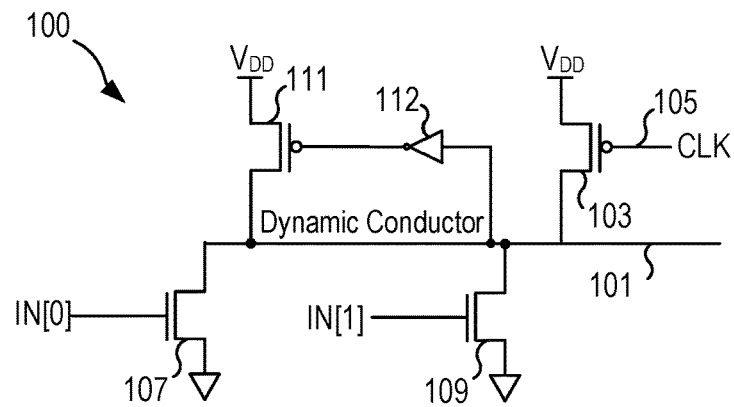
FIG. 1 illustrates a prior art dynamic circuit.
Figure 2:
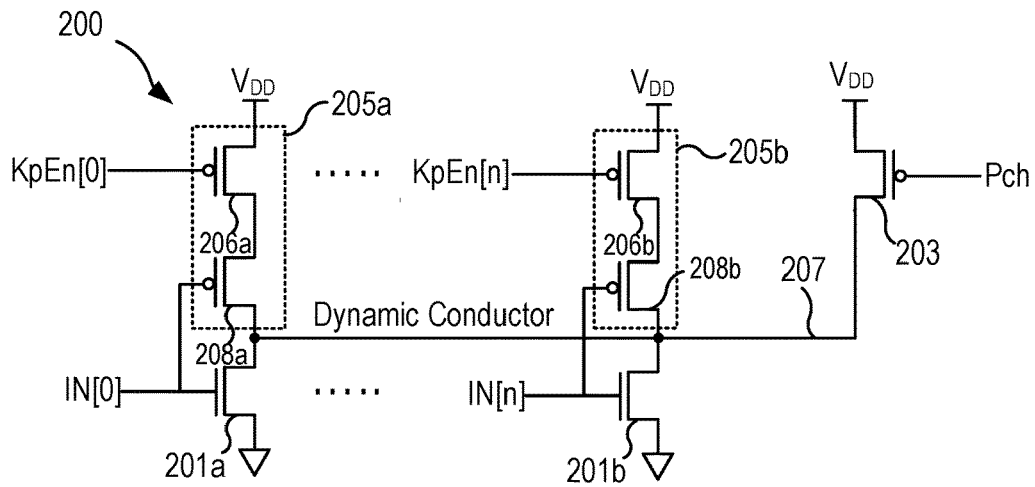
FIG. 2 illustrates a dynamic circuit that may be utilized in one or more embodiments.

FIG. 2 illustrates a dynamic circuit 200 that may be utilized in one or more embodiments. The dynamic circuit 200 includes pull-down circuits provided by transistors 201a and 201b, a pre-charge pull-up circuit provided by pull-up transistor 203, and keeper pull-up circuits 205a and 205b respectively receiving keeper enable signals KpEn[0] and KpEn[n]. The keeper pull-up circuits also respectively receive the input signals IN[0] and IN[n].

Figure 3:
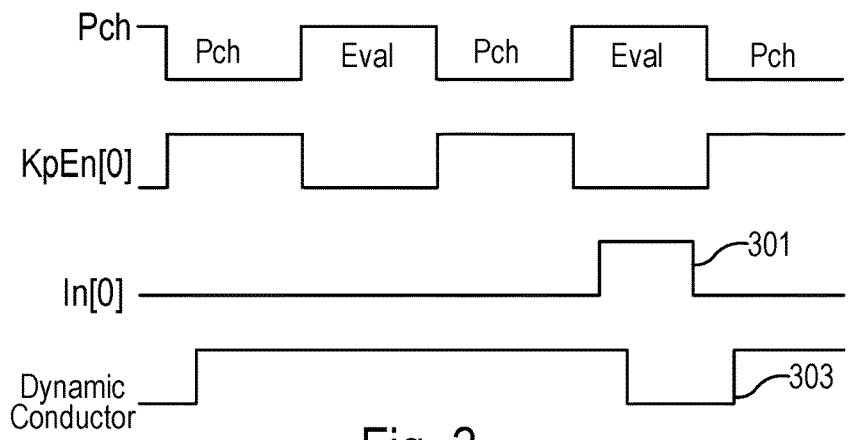
FIG. 3 illustrates a timing diagram associated with the dynamic circuit of FIG. 2.

FIG. 3 illustrates a timing diagram associated with the dynamic circuit 200 showing the pre-charge phase (Pch) and the evaluate phase (Eval). FIG. 3 illustrates operation of the dynamic circuit for only a single input IN[0] for ease of illustration assuming that the second input IN[n] is at a 0. The pre-charge pull-up transistor 203 couples dynamic node 207 to the supply potential $V_{DD}$ during the pre-charge phase (Pch) to charge the dynamic node to a high voltage potential.

During the evaluate phase only one of the keeper enable signals KpEn[0] and KpEn[n] switch low to activate one of the transistors 206a and 206b in the keeper pull-up circuits 205a and 205b. In the embodiment of FIG. 2, the keeper enable signals are "one-cold" (only one keeper enable signal active low at a time). The keeper signal that switches low corresponds to the input signal being evaluated. The dynamic node 207 either remains at a high potential or discharges through one of the pull-down transistors 201a and 201b depending on the value of the input signal being evaluated. Assuming IN[0] is being evaluated, if IN[0] remains low, keeping the pull-down transistor 201a off, the dynamic node 207 remains at a high voltage level. IN[0] being low activates the keeper pull-up transistor 208a. The keeper pullup network 205a pulls up the dynamic node through transistors 206a and 208a. The keeper pullup network 205b remains off since KpEn[n] remains high (deasserted). If IN[0] evaluates high as shown at 301 in FIG. 3, the keeper pullup network 205a switches off because transistor 208a is off and the pull-down transistor 201a activates. The dynamic conductor discharges to ground at 303 through the activated pull-down transistor. Note that while FIG. 2 shows two keeper circuits (205a and 205b) and two pull-down circuits (201a and 201b), the dynamic circuit 200 can be extended to be N-wide dynamic NOR structures rather than just the two structures shown in FIG. 2. Note also that in other embodiments the stack order for transistors ((206a, 208a) and (206b, 208b)) in the pull-up circuits can be reversed so transistors 206a and 206b connect directly to the dynamic node 207 and 208a and 208b connect to $V_{DD}$.

The keeper pull-up keeper circuits 205a and 205b only need be large enough to prevent errors due to leakage, noise, and/or charge sharing for some pull-down networks. Since the transistors in the keeper circuit is small, the keeper circuit does not significantly impact performance due to either gate loading or crossover current with the pull-down network. The pull-up keeper circuits avoid contention quickly when discharging the dynamic node 207 through a pull-down transistor by simultaneously disabling one of the transistors of the keeper pull-up circuit. In one embodiment, a typical size ratio of transistor 201a to 206a or 201a to 208a is in the range of 4:1 to 16:1. For dynamic circuits with single-stack PMOS keepers and single-stack NMOS pull-downs, the range could be 8:1 to 32:1. That is for a technology with PMOS strength approximately equal to NMOS strength. For older technologies where NFETs were approximately 2× stronger than PFETs, the range of single stack NMOS pulldown to single-stack PMOS pull-up could be 4:1 to over 16:1. The larger ratios were usually achieved by using low-leakage high-Vt, long-channel pulldown devices that are slower than mid-voltage devices. The transistor size ratios can vary in any particular embodiment based on process technology and other design considerations.

Figure 4:
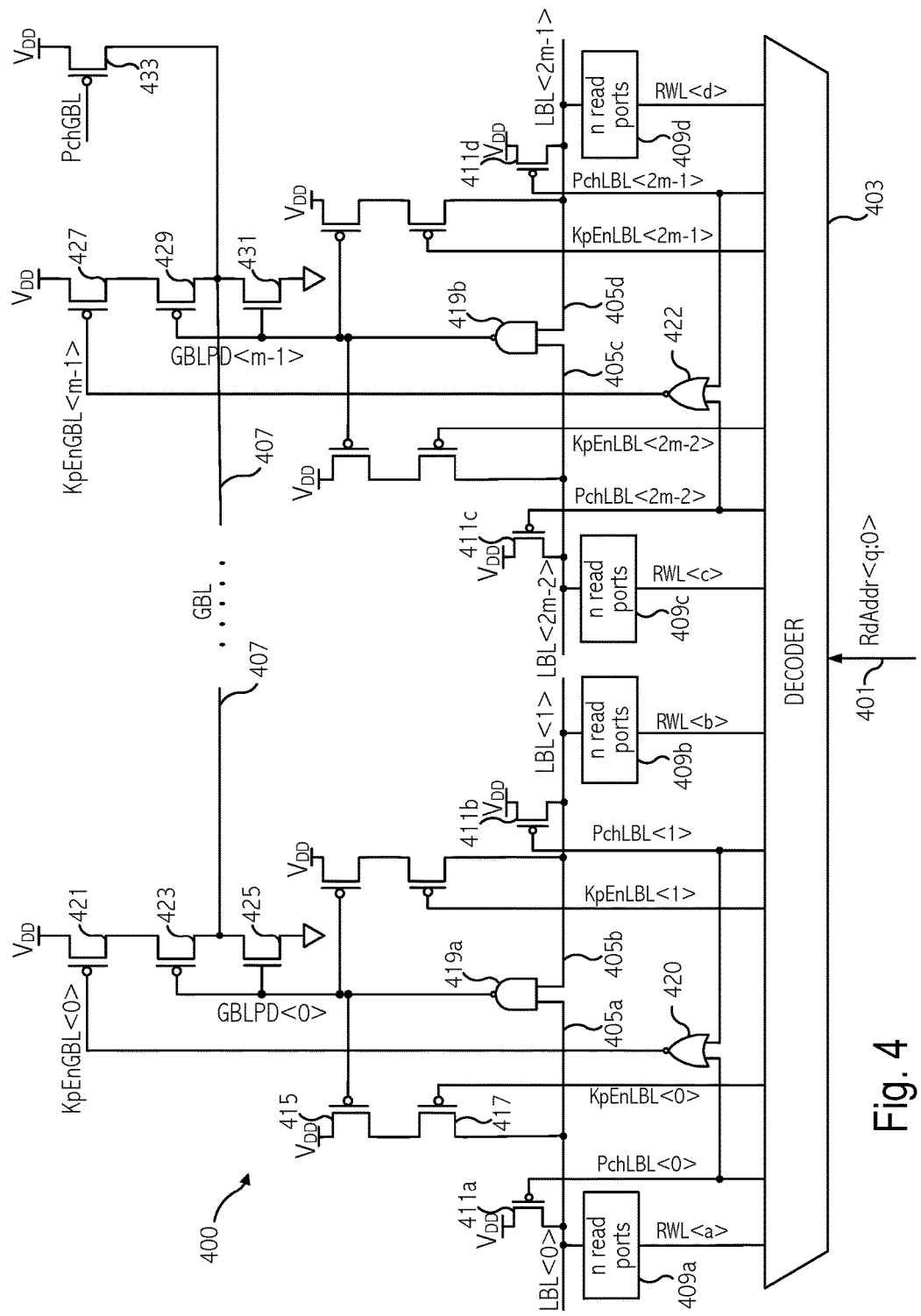
FIG. 4 illustrates a memory structure utilizing dynamic circuits according to an embodiment.
Figure 5:
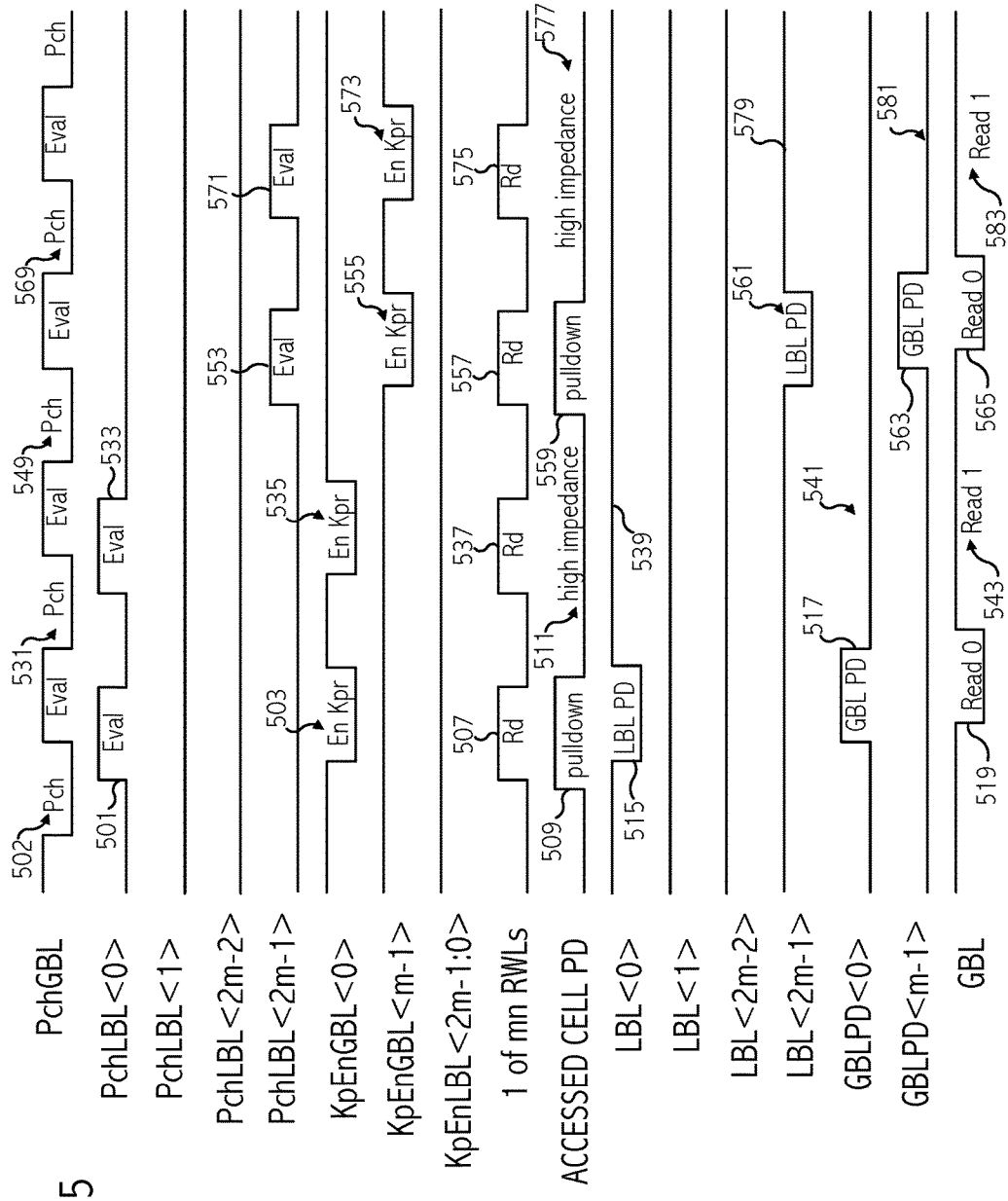
FIG. 5 illustrates a timing diagram associated with the memory structure of FIG. 4.

FIG. 4 illustrates a memory structure 400 that utilizes the dynamic NOR structure illustrated in FIG. 2. FIG. 5 illustrates a timing diagram associated with the memory structure 400. The memory structure 400 decodes a read address 401 in decoder 403. The memory structure 400 includes four local bit lines 405a, 405b, 405c, and 405d (LBL<0>, LBL<1>, LBL<2m−2>, LBL<2m−1>). The local bit lines determine the value of the global bit line 407. The decoder supplies pre-charge and keeper enable signals as described further herein. The memory structure 400 includes separate groups of n read ports 409a, 409b, 409c, and 409d. The groups of read ports 409a, 409b, 409c, and 409d each include n memory cells (one read port per memory cell) that are addressed by the read word lines RWL. For example, the group of read ports 409a may include 16 read ports and 16 memory cells (n=16). In the illustrated embodiment RWL<a>=RWL<n−1:0>, RWL<b>=RWL<2n−1:n>, RWL<c>=RWL<(2m−1)n−1:(2m−2)n>, and RWL<d>=RWL<2mn-1:(2m−1)n>, where m is the number of keeper structures and n is the number of read ports in each group of read ports. RWL<n−1:0> selects a memory cell in then read ports 409a. Each of the memory cells may have an 8 transistor (8T) cell structure, a 6T memory cell, or another configuration. As an example, a 8T memory cell is illustrated in FIG. 6. Note that the two NMOS transistors 601 and 603 pull down the local bit line to ground when activated.

The local bit lines function as the dynamic nodes of respective dynamic circuits associated with each of the local bit lines. The pre-charge transistor 411a pre-charges the local bit line LBL<0> to a high voltage potential when the pre-charge signal PchLBL<0> supplied from the decoder is at a low potential. Transistors 415 and 417 function as a pull-up keeper circuit. NAND gate 419a, which logically combines the local bit lines LBL<0> and LBL<1>, controls the top transistor 415 of the pull-up keeper circuit for the local bit line LBL<0>. The decoder 403 controls the bottom transistor 417 with the keeper enable signal KpEnLBL<0>. The pull-down device of the dynamic circuit may be, e.g., the NMOS transistors 601 and 603 shown in FIG. 6. In an embodiment, each of the dynamic circuits associated with the local bit lines utilizes a delayed onset keeper, as described in U.S. Pat. No. 7,977,977, which patent is incorporated herein by reference in its entirety. For example, in an embodiment, when the clocks are sufficiently slow, the decoder 403 delays activation of transistor 417 to avoid contention between the pull-up and pull-down devices in the dynamic circuit. In other embodiments, the pull-up keeper may not be used at all or not be used when the clocks are above a threshold frequency. FIG. 5 illustrates an embodiment in which the keeper enable signals KpEnLBL<3:0> remain low during the read cycles. Each of the bit lines typically have an associated identical dynamic structure. In addition, because the transistors 423 and 425 are PMOS and NMOS, respectively, when one transistor turns on, the other transistors turns off thereby avoiding contention between the pull-up keeper circuit and the pull-down circuit.

The memory structure 400 also includes the dynamic NOR structure shown in FIG. 2, with the global bit line 407 corresponding to the dynamic node 207 shown in FIG. 2. The dynamic NOR structure includes the pull-up keeper transistors 421 and 423 (corresponding to keeper 205a) and the pull-down transistor 425. The dynamic NOR structure further includes the pull-up keeper transistors 427 and 429 (corresponding to keeper 205a) and the pull-down transistor 431. The pre-charge transistor 433 pre-charges the global bit line 407 to a high potential when activated by the control line PchGBL as shown in FIG. 5. The pre-charge/evaluate cycle shown in FIG. 5 assumes consecutive reads of the memory. The output of NAND gate 419a controls transistors 423 and 425 such that the global bit line 407 is pulled down to a low voltage potential if either of the local bit lines LBL<0> or LBL<1> are low. Otherwise, the global bit line 407 remains at a high voltage, which is maintained by the pull-up keeper circuit formed by transistors 421 and 423. The structure 400 can have m groups of keepers and pull-down networks. With two groups of keepers and pulldown networks (shown in FIG. 4 as transistors 421, 423, 425 and 427, 429, 431), m=2). However, in other embodiments m can equal 2, 4, 6, 7, 8 or any suitable number of groups of keepers and pull-down networks for the particular implementation.

With reference to FIGS. 4 and 5, the decoder 403 supplies the pre-charge signals (PchLBL<0>, PchLBL<1>, PchLBL<2m-2>, and PchLBL<2m-1>) to pre-charge the local bit lines. The decoder 403 turns off the pre-charge signal at 501 only for the local bit line associated with one of the n read ports that is addressed. The global bit lines are pre-charged at 502. That allows the addressed bit line to control the output of NAND gate 419a. In addition to turning off the local bit line pre-charge transistor, a logical NOR of the pre-charge signals associated with two bit lines, e.g., PchLBL<0> and PchLBL<1> in NOR gate 420 controls the transistor 421 of the pull-up keeper circuit. During evaluate, only one of the keeper enables (KpEnGBL<i>) transitions low based on which pull-down network may activate. Thus, in the embodiment of FIG. 4, NOR gate 420 determines the value of the keeper enable signal (KpEnGBL<0>). Similarly, the NOR gate 422 controls the keeper enable signal KpEnGBL<m-1>. Note that the global keeper enable signals (KpEnGBL<0> and KpEnGBL<m-1>) should be one-cold (only one active low at a time). Note that NOR gates 420 and 422 may be included in the decoder logic if desired. The global keeper enable signal should be enabled only when an input is to be evaluated by an associated portion of the dynamic circuit, and, e.g., the corresponding pull-down circuit may switch. Thus, referring to FIG. 5, KpEnGBL<0> is enabled at 503 responsive to a memory cell coupled to local bit line LBL<0> being read.

FIG. 5 illustrates reads of zeros and ones from memory cells in the memory structure 400. The timing shown represents generally the sequence of read operations in the memory structure 400 and the exact timing on any particular embodiment will of course vary based on the particular design. Consider the case when a read wordline (RWL) of read ports 409a activates and the read port discharges the pre-charged local bit line. That causes a low-to-high transition at the output of the NAND gate 419a, which is the input to the contention-free dynamic logic provided by transistors 423 and 425, which switch based on the same gate signal. Now when the global pull-down signal GBLPD<0> goes to a high voltage potential turning off the keeper network by deactivating transistor 423, the pull-down transistors 425 can discharge the global bit line 407 free of contention. If, on the other hand, the RWL activates and the local bit line is not discharged, the global bit line remains high and is held at a high voltage potential by the two series connected PMOS keeper devices 421 and 423. The local bit lines will remain high and held by a keeper (transistors 415 and 417) at low frequencies once the delayed onset keeper activates transistor 417.

Referring to FIGS. 5 and 6, the read address supplied to the decoder, e.g., at 507 accesses one of the groups of read ports (RWL<n-1:0>). The value of the accessed cell 605 determines the value of the local bit line when RWL is asserted with a low voltage cell value being represented by an asserted pull-down at 509 and a high voltage value being indicated by the high impedance state at 511. Asserting the pull-down (transistors 601 and 603 activated), results in the local bit line LBL<0> being pulled low at 515. A low on LBL<0> causes the global pull-down signal GBLPD<0> to be asserted (517) at transistor 425 pulling the global bit line 507 low at 519 indicating a zero being read from the addressed memory location during the global bit line evaluation.

FIG. 5 shows a second read operation. The second read operation includes Pch 531, evaluation of PchLBL<0> at 533, asserting KpEnGBL<0> at 535 (active low), Rd 537, high impedance for the accessed cell pull down resulting in LBL<0> being evaluated high at 539, causing global pull-down GBLPD<0> to be low at 541 resulting in the second bit being read as a one (Read 1) at 543 during the global bit line evaluation.

FIG. 5 shows a third read operation that reads a zero from read ports 409d. The third read operation includes Pch 549, evaluation of PchLBL<2m-1> at 553, asserting KpEnGBL<m-1> at 555, Rd 557, asserting pull-down for the accessed cell at 559 resulting in LBL<2m-1> being evaluated low at 561, causing global pull-down GBLPD<m-1> to be high at 563 resulting in a read of zero (Read 0) at 565 during the global bit line evaluation.

FIG. 5 further shows a fourth read operation for reading a one from read ports 409d. The fourth read operation includes Pch 569, evaluation of PchLBL<3> at 571, asserting KpEnGBL<m-1> at 573, Rd at 575, the pull-down for the accessed cell being high impedance at 577 resulting in LBL<3> being evaluated high at 579, causing global pull-down GBLPD<m-1> to be low at 581 resulting in a read of one (Read 1) at 583 during the global bit line evaluation.

FIG. 7 provides a table showing the values of the various control signals in FIG. 4 during pre-charge, a read of a zero (Read 0), and a read of a one (Read 1). FIG. 7 is consistent with the graphical representation of the values of the various control signals during the pre-charge, Read 0, and Read 1 operations. FIG. 7 also shows the logical constraints during reads that are guaranteed by the decoder 403 for the embodiment shown in FIG. 4. Note that "one-hot" refers to one of a group of the control lines being at a high voltage potential and the rest of the group being at a low voltage potential. The term "one-cold" refers to one of a group of the control lines being at a low voltage potential and the rest of the group being at a high voltage potential.

Figure 8:
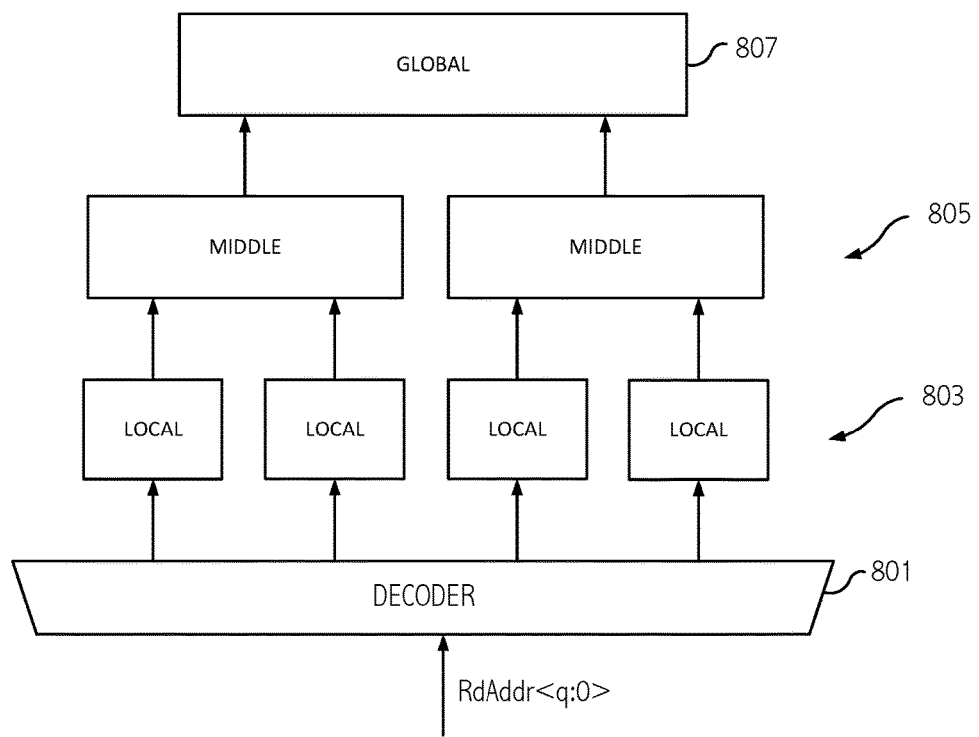
FIG. 8 illustrates a high level block diagram of a three dynamic stage memory structure.

While FIG. 4 illustrates a static RAM (SRAM) design with a two-stage dynamic read structure, other static RAM designs may also utilize the contention free dynamic logic structure described herein. For example, FIG. 8 shows an SRAM with three-dynamic stages with the decoder 801 supplying a local bit line stages 803, which in turn supplies middle stages 805. The middle stages 805 supply the global stage 807. The number of local, middle, and global stages shown is exemplary and other embodiments have more or few stages at each level. The contention free dynamic logic structure shown in FIG. 2 can be utilized in, e.g., the middle and global stage, or in any one or all of the stages. In addition, a single dynamic stage design may utilize the contention free dynamic logic structure described in FIG. 2. Further, the contention free dynamic logic structure described herein may be utilized in non-SRAM applications such as dynamic result trees with local/global dynamic nets, content addressable memory, or dynamic OR/multiplexer structures.

Thus, embodiments for contention free operation of dynamic circuits have been described that avoid the traditional contention between a logical pull-down network and a keeper pullup network in dynamic logic. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   pre-charging a global bit line responsive to assertion of a global bit line pre-charge signal;
   decoding a read address at a decoder circuit;
   pre-charging a first local bit line responsive to a first local bit line pre-charge signal supplied from the decoder circuit;
   pre-charging a second local bit line responsive to a second local bit line pre-charge signal supplied from the decoder circuit;
   activating a first global keeper transistor coupled between a voltage supply node and the global bit line responsive to the first local bit line pre-charge signal or the second local bit line pre-charge signal being deasserted;
   activating a pull-down transistor coupled between the global bit line and a ground node responsive to a global pull-down signal being asserted, the global pull-down signal being asserted responsive to the first local bit line being at a first value or the second local bit line being at the first value; and
   supplying the global pull-down signal to a first gate of a first local bit line keeper transistor of a first local bit line keeper circuit coupled between the voltage supply node and the first local bit line.

2. The method as recited in claim 1 further comprising:
   turning off a second global keeper transistor serially coupled with the first global keeper transistor between the voltage supply node and the global bit line responsive to the first local bit line being at the first value or the second local bit line being at the first value.

3. The method as recited in claim 1 further comprising:
   supplying a plurality of N read word lines from the decoder circuit to a first group of memory cells, N being an integer;
   giving the first local bit line a value based on a first memory cell associated with one of the N read word lines; and
   activating the first global keeper transistor responsive to the first local bit line pre-charge signal being deasserted.

4. The method as recited in claim 1 further comprising:
   supplying a second plurality of N read word lines from the decoder circuit to a second plurality of memory cells;
   giving the second local bit line a value based on a second memory cell associated with one of the second plurality of N read word lines; and
   activating the first global keeper transistor responsive to the second local bit line pre-charge signal being deasserted.

5. The method as recited in claim 1 further comprising:
   pre-charging a third local bit line responsive to a third local bit line pre-charge signal supplied from the decoder circuit;
   pre-charging a fourth local bit line responsive to a fourth local bit line pre-charge signal supplied from the decoder circuit;
   activating a second global keeper transistor responsive to the third local bit line pre-charge signal or the fourth local bit line pre-charge signal being deasserted.

6. An apparatus comprising:
   a first pre-charge transistor coupled between a voltage supply node and a global bit line;
   a first global keeper circuit including a first keeper transistor and a second keeper transistor coupled between the voltage supply node and the global bit line;
   a second pre-charge transistor coupled between the voltage supply node and a first local bit line;
   a third pre-charge transistor coupled between the voltage supply node and a second local bit line;
   a first global pull-down circuit coupled to receive a first global pull-down signal, the first global pull-down circuit including a pull-down transistor coupled between the global bit line and a ground node; and
   a first global keeper enable signal coupled to a gate of the first keeper transistor, the first global keeper enable signal being a logical combination of a second pre-charge control signal coupled to a gate of the second pre-charge transistor and a third pre-charge control signal coupled to a gate of the third pre-charge transistor; and
   a first local bit line keeper circuit including a third keeper transistor coupled between the voltage supply node and the first local bit line, wherein a gate of the third keeper transistor is coupled to the first global pull-down signal.

7. The apparatus as recited in claim 6, wherein a first logic circuit logically combines a first local bit line and a second local bit line to generate the first global pull-down signal and is coupled to activate the second keeper transistor according to a first value of the first global pull-down signal and to turn off the pull-down transistor responsive to the first value of the first global pull-down signal.

8. The apparatus as recited in claim 6, further comprising:
   a second logic circuit to logically combine the second pre-charge control signal and the third pre-charge control signal and provide the first global keeper enable signal.

9. The apparatus as recited in claim 6, further comprising:
   a decoder circuit coupled to receive a read address and supply the second pre-charge control signal and the third pre-charge control signal.

10. The apparatus as recited in claim 9, further comprising:
    a second local bit line keeper circuit including a fifth keeper transistor and a sixth keeper transistor coupled between the voltage supply node and the second local bit line, the fifth keeper transistor coupled to receive the first global pull-down signal.

11. The apparatus as recited in claim 10, further comprising:
    a fourth keeper transistor coupled in series with the third keeper transistor between the voltage supply node and the first local bit line;
    wherein the decoder circuit is coupled to supply a first local bit line keeper enable signal to the fourth keeper transistor and the decoder circuit is coupled to supply a second local bit line keeper enable signal to the sixth keeper transistor.

12. The apparatus as recited in claim 9, further comprising:
    first plurality of read ports coupled to receive a first plurality of read word lines from the decoder circuit and coupled to supply the first local bit line; and
    a second plurality of read ports coupled to receive a second plurality of read word lines from the decoder circuit and coupled to supply the second local bit line.

13. The apparatus as recited in claim 6 further comprising:
    a second global keeper circuit including a fifth keeper transistor and a sixth keeper transistor coupled between the voltage supply node and the global bit line;

a second global pull-down circuit including a second pull-down transistor coupled between the global bit line and the ground node.

14. The apparatus as recited in claim 6 wherein a value of the global bit line is determined according to a value of a plurality of local bit lines including the first and second local bit line.

15. The apparatus as recited in claim 11 wherein the decoder circuit delays activation of the fourth keeper transistor according to a frequency of a clock signal.

16. The method as recited in claim 1 further comprising:
supplying to a second gate of a second local bit line keeper transistor of the first local bit line keeper circuit a first local bit line keeper enable signal from the decoder circuit.

17. The method as recited in claim 16 further comprising:
supplying a third gate of a third local bit line keeper transistor of a second local bit line keeper circuit coupled between the voltage supply node and the second local bit line with the global pull-down signal; and
supplying a fourth gate of a fourth local bit line keeper transistor of the second local bit line keeper circuit with a second local bit line keeper enable signal from the decoder circuit.

18. The apparatus as recited in claim 9 further comprising:
a fourth keeper transistor coupled in series with the third keeper transistor between the voltage supply node and the first local bit line; and
wherein the decoder circuit is coupled to supply a first local bit line keeper enable signal to the fourth keeper transistor.

* * * * *